(12) United States Patent
Beddingfield et al.

(10) Patent No.: US 7,741,567 B2
(45) Date of Patent: Jun. 22, 2010

(54) INTEGRATED CIRCUIT PACKAGE HAVING INTEGRATED FARADAY SHIELD

(75) Inventors: Stanley Craig Beddingfield, McKinney, TX (US); Jean-Francois Drouard, Lerouret (FR)

(73) Assignee: Texas Instruments Incorporated, Dallas, TX (US)

( * ) Notice: Subject to any disclaimer, the term of this patent is extended or adjusted under 35 U.S.C. 154(b) by 158 days.

(21) Appl. No.: 12/123,115

(22) Filed: May 19, 2008

(65) Prior Publication Data

US 2009/0284947 A1 Nov. 19, 2009

(51) Int. Cl.
*H05K 9/00* (2006.01)
(52) U.S. Cl. .................. 174/386; 361/818; 257/659; 257/686
(58) Field of Classification Search ........... 174/377, 174/386; 361/818, 816; 257/659, 686
See application file for complete search history.

(56) References Cited

U.S. PATENT DOCUMENTS

| 6,432,253 | B1 | 8/2002 | Chung |
| 6,515,870 | B1 | 2/2003 | Skinner et al. |
| 6,618,267 | B1 * | 9/2003 | Dalal et al. ............ 361/767 |
| 6,865,084 | B2 * | 3/2005 | Lin et al. ............ 361/704 |
| 7,102,892 | B2 * | 9/2006 | Kledzik et al. ........ 361/770 |
| 7,176,506 | B2 | 2/2007 | Beroz et al. |
| 7,215,022 | B2 * | 5/2007 | Chan et al. ............ 257/724 |
| 2005/0011656 | A1 * | 1/2005 | Patterson ............ 174/35 R |
| 2006/0102992 | A1 | 5/2006 | Kwon et al. |
| 2007/0296087 | A1 | 12/2007 | Ogata et al. |
| 2008/0036096 | A1 | 2/2008 | Karnezos |

* cited by examiner

*Primary Examiner*—Hung V Ngo
(74) *Attorney, Agent, or Firm*—Yingsheng Tung; Wade J. Brady, III; Frederick J. Telecky, Jr.

(57) ABSTRACT

A packaged integrated circuit (IC) (100) includes a first substrate (110) including a first plurality of layers and first circuit coupling features (112) at an upper surface of the first substrate (110). The first plurality of layers include a first electromagnetic interference shielding layer (132). The packaged IC also includes a second substrate (106) having an upper surface attached to a lower surface of the first substrate (110) by an electrically conductive adhesive material (136). The second substrate (106) includes a second plurality of layers and a second circuit coupling feature (108) at a lower surface of the second substrate (106). The first plurality of layers includes a second EMI shielding layer (134). The packaged IC further includes a functional die (124) disposed between the first (110) and the second (106) substrates and functionally coupled to the first (112) and/or the second (108) circuit coupling features. In the packaged IC, the adhesive material (136) electrically couples the first (132) and the second (134) shielding layers.

20 Claims, 5 Drawing Sheets

INTEGRATED CIRCUIT PACKAGE HAVING INTEGRATED FARADAY SHIELD

FIELD OF THE INVENTION

The present invention relates generally to integrated circuit packages and, more particularly, to structures and techniques for modulating electromagnetic interference in integrated circuit packages.

BACKGROUND

As the demand for faster, smaller electronic products with increased functionality is increased, some designers have turned to system-in-package (SIP) solutions. A SIP typically includes several different types of integrated circuits (ICs) integrated into a single IC package. However, in recent years, stacked packaging schemes, such as package-on-package (POP) configurations, have been used in place of SIP's. Typically, by allowing stacking of different semiconductor packages, the required footprint size for a semiconductor package in an electronic product can be reduced. Furthermore, because some stacked packages, such as POP packages, provide a modular solution by allowing different combinations semiconductor packages to be stacked, designers can generally design different types of electronic devices using a few single semiconductor package footprints.

Some types of integrated circuits (ICs), including those used in stacked packages, are known to radiate a relatively large amount of electromagnetic energy during periods of operation. For example, microprocessors and other digital processing devices are recognized as major sources of electromagnetic radiation in computer systems. The electromagnetic energy radiated by such devices can interfere with the operation of other devices or circuits in the vicinity of the radiating IC, including those ICs in the same stacked package, and is therefore generally undesirable.

A number of techniques have been used in the past to reduce the level of electromagnetic interference (EMI) emanating from an IC, or to protect ICs from EMI. Typically such techniques require that a generally conductive cage structure be formed around the IC using a stamped sheet metal cage member that can have a plurality of legs spaced about a periphery thereof. The cage member is then placed over the IC package and is coupled to a corresponding ground pad on an underlying circuit board. The ground pads of the circuit board are each conductively coupled to a ground plane of the circuit board using, for example, via connections. In this manner, the generally conductive shield for blocking EMI, known as a Faraday cage, is formed around the IC. However, the use of conventional Faraday cages in stacked packaging schemes, such as POP packaging, typically increases the overall dimensions of the package and can eliminate at least a portion of the sizing advantages originally obtained through stacked packaging schemes.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

With the increasing popularity of stacked packing schemes, such as POP packaging, the number of applications in which they are used has also increased. However, incorporating EMI sensitive ICs into such packages has been difficult due to the increased dimensions resulting from the incorporation of Faraday cages. Even worse, if designers wish to incorporate an EMI generating IC and an EMI sensitive IC into a single POP package, the proximity of EMI generating IC may prevent doing so. For such packing technologies, the Present Inventors have found that the addition of conventional Faraday cage structures not only increases size of the POP packages, but also increases the cost and complexity for the packages and electronic devices they are used in. In response to these problems, embodiments of the present invention provide schemes for implementing Faraday cages in stacked ICs packages without the addition of a separate Faraday cage structure. In particular, the Present inventors have discovered that by incorporating shield layers into existing electronic substrates used for creating stackable packages and applying a polymer-comprising conductive epoxy to electrically contact the shield layers, a Faraday cage can be provided therebetween without increasing the overall dimensions of the package, and without the need for additional structures to be incorporated into the package.

In a one embodiment of the present invention, a packaged integrated circuit is provided. The packaged integrated circuit can include a first electronic substrate having a first plurality of layers and at least a first circuit coupling feature at an upper surface of the first electronic substrate, the first plurality of layers comprising at least a first electromagnetic interference (EMI) shielding layer. The packaged integrated circuit can also include a second electronic substrate having an upper surface attached to a lower surface of the first electronic substrate by one or more portions of an electrically conductive adhesive material, the second electronic substrate comprising a second plurality of layers and at least a second circuit coupling feature at a lower surface of the second electronic substrate, the first plurality of layer comprising at least a second EMI shielding layer. In the packaged integrated circuit, at least one functional die is disposed between the first and the second electronic substrate and functionally coupled to at least one among the first and the second circuit coupling features. Furthermore, each of the adhesive material portions electrically couples the first and the second shielding layers.

In another embodiment of the present invention, a method for packaging an integrated circuit is provided. The method can include providing a first electronic substrate comprising a first plurality of layers and at least a first circuit coupling feature at an upper surface of the first electronic substrate, where the first plurality of layer comprises at least a first electromagnetic interference (EMI) shielding layer. The method can also include providing a second electronic substrate comprising a second plurality of layers and at least a second circuit coupling feature at a lower surface of the second electronic substrate, where the second plurality of layers comprises at least a second EMI shielding layer. The method can further include attaching at least one functional die to a lower surface of the first electronic substrate or an upper surface of the second electronic substrate and functionally coupling the functional die to at least one among the first and the second circuit coupling features. The method also can include attaching the upper surface of the second electronic substrate to the lower surface of the first electronic substrate by one or more portions of an electrically conductive adhesive, where each of the adhesive portions electrically couple the first and the second shielding layers.

DETAILED DESCRIPTION

Figure 1:
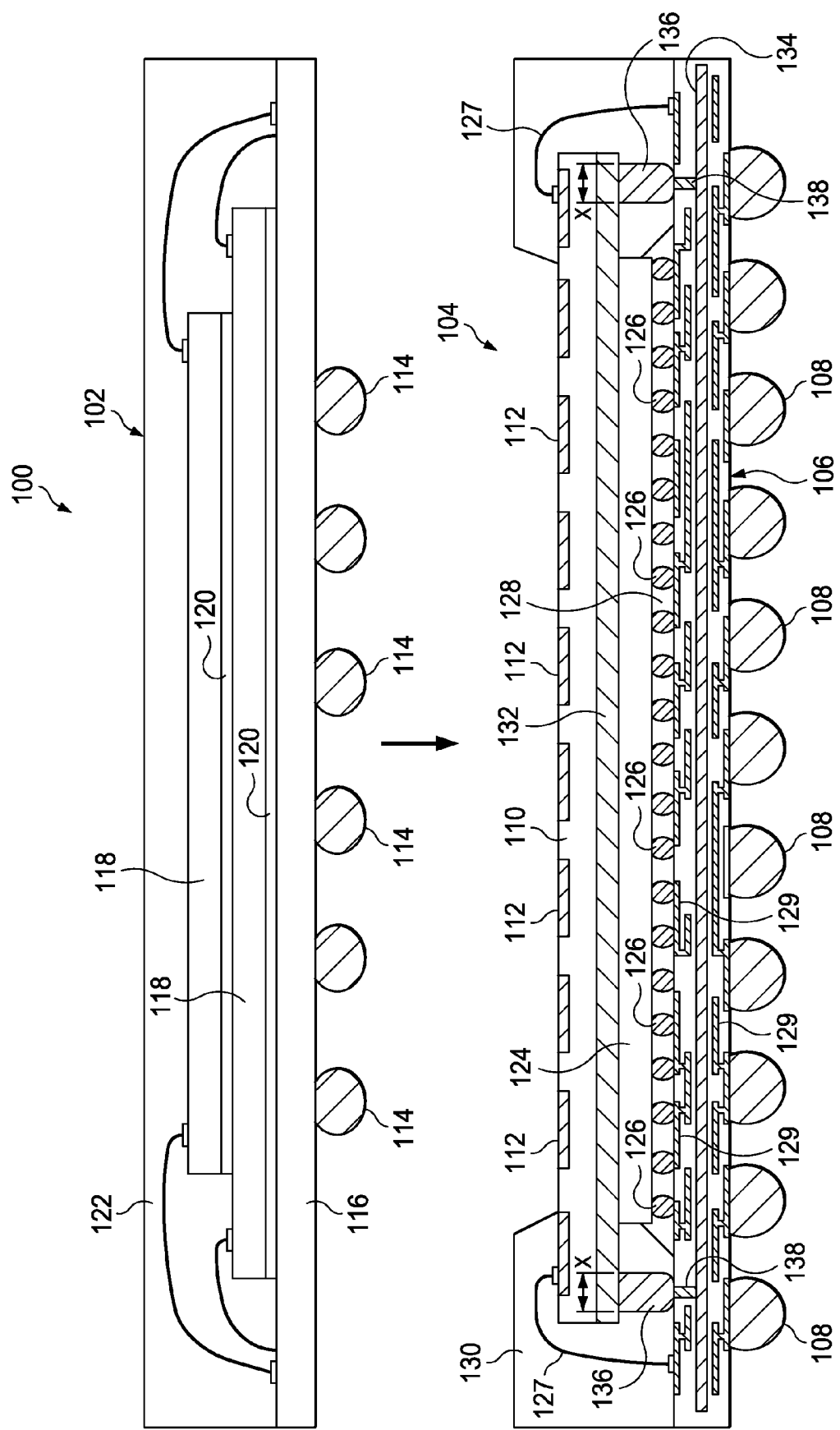
FIG. 1 shows an exploded view of an exemplary multi-chip stacked packaging system, according to an embodiment of the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the present invention provide structures and methods for reducing electromagnetic interference in integrated circuits (ICs). In particular, the Present Inventors have discovered that existing stacked packaging technologies, such as POP packaging, can be modified to provide Faraday cages for one or more stacked IC without significantly increasing the overall size of the package. As such, the sizing advantages of POP packaging can be preserved without significant changes to the POP package process flow.

Conventional techniques for providing Faraday cages are based on the basic idea of providing a grounded metal enclosure to surround the EMI-sensitive or EMI-generating IC. Typically, such structures are provided by using stamped metal structures or by attaching a solid metal lid portion to solid metal wall portions placed around the IC to be shielded. In another technique, a conductive material can be sprayed over the IC package to be shielded. However, while such techniques can be used effectively to shield multiple ICs in a planar arrangement, such techniques are typically impractical for shielding one or more individual stacked dies or packages. As a result, conventional techniques still require that EMI-generating ICs and EMI-sensitive ICs (collectively "EMI reactive ICs") to be packaged separated and, more importantly, be placed in different planar locations in an electronic device. Thus, the different planar locations for these EMI reactive ICs increase the overall area needed for these ICs in an electronic device, such as on a circuit board of an electronic device.

The Present Inventors note that the basic requirement for forming a Faraday cage is that the object to be shielded is placed within an enclosure comprising a grounded electrically conducting material. The enclosure need not be continuous, but any openings should significantly smaller than the wavelengths of the EMI to be blocked. Furthermore, the walls of the enclosure should be of a sufficient thickness. That is, the thickness should be sufficient large such that the EMI affects only a outer portion of the thickness (skin depth) of the enclosure walls of the enclosure. The thickness required can vary as the electrical conductivity of the enclosure material varies and as the type of EMI varies. Generally, as electrical conductivity of the enclosure material increases, the thickness of material required to block EMI decreases and vice versa. Therefore, an electromagnetic layer requires a layer that is not only electrically conductive and but that has a thickness greater than a skin depth for the EMI to be blocked. In cases where the EMI generating IC is within the enclosure, the same principles apply with the exception that skin depth is measured from the interior of the enclosure.

With these requirements in mind, the Present Inventors have discovered that for at least certain types of stacking packaging technologies, such as POP packaging, a Faraday cage can be formed by modifications of the package, modifications that generally do not require the size of the package to be significantly increased. In particular, the Present Inventors have discovered that a Faraday cage can be formed by electrically coupling shielding layers in upper and lower electronic substrates of a conventional stacked package. That is, a lower shielding layer can be formed in one of the layers of a first multilayer printed circuit board (PCB) or other electronic substrate typically used for mounting the package on an electronic device board. However, in the case of stacked packages, an IC is typically sandwiched between the first electronic substrate and a second electronic substrate. In such configurations, the second electronic substrate typically provides mounting or coupling features for electrically and/or mechanically attaching one ore more second ICs (stacked dies), other IC packages (stacked packages), or discrete electrical devices and components. The first electronic substrate can also include coupling features. Coupling features, by way or example and not limitation, can include electrical terminals or leads and/or physical structures for attaching dies, packages, or discrete electrical devices and components. Regardless of the type of coupling features, a second shielding layer can be formed in or on the layers of the second electronic substrate. Introducing such layers into electronic substrates typically only requires addition of a thin layer of metal having a thickness that is only a fraction of the thickness of the electronic substrate it is being added to. For example, in a typical POP package, the metal layer thickness typically required for providing adequate shielding from adjacent RF-generating IC's are at least 10 um of a primarily copper alloy, and normally between 15 and 20 um.

Generally, POP packages use a non-electrically conductive molding or encapsulating material to encapsulate the first and second electronic substrates and the IC sandwiched in between. However, embodiments of the present invention replace at least a portion of this encapsulating material disposed between facing surfaces of the first and second electronic substrates with a conductive adhesive material coupling the shield layers therein. That is, a material that is electrically conductive in its final or cured state and that adheres to at least conducting portions of the first and second electronic substrates. For example, some silver-based and carbon (graphite)-based polymer-comprising adhesives are known to provide good electrical conductivity, such as silver-based and graphite-based epoxies. However, in the various embodiments, any type of organic or inorganic conductive material with adhesive properties, including metal or non-metal comprising materials, relative to the facing surfaces of the first and second electronic substrates can be used. For example, a metal-comprising solder material can also be used as an adhesive. Furthermore, the conductive adhesive can be placed in a pattern around the sandwiched IC to electrically couple the upper and lower shield layers and electromagnetically surround the sandwiched IC. Therefore, embodiments of the present invention provide a Faraday cage for the sandwich IC, having upper and lower shield layers of the Faraday cage formed using layers of the first and second electronic substrates and sidewalls of the Faraday cage formed from the conductive adhesive.

FIG. 1 shows an exploded view of an exemplary multi-chip stacked packaging system, according to an embodiment of the present invention. In FIG. 1, the system 100 includes a top package 102 and a bottom package 104. The bottom package 104 includes a lower substrate 106 having a plurality of leads 108 extending downward for coupling the package system 100 to a device board (not shown). The bottom package 104 also includes an upper electronic substrate 110 having a plurality of terminals 112 coupled to at least some of the leads 108 of the lower electronic substrate 106. The terminals 112 can also be configured to receive and couple to a plurality of leads 114 extending from the lower electronic substrate 116 of the top package 102.

In the various embodiments, the top package 102 includes one or more functional IC dies 118 electrically coupled to its lower electronic substrate 116. The top package 102 can also include one or more adhesive layers 120 between the ICs 118 and its lower electronic substrate 116 and a package molding 122. When assembled, the top package 102 is placed on top of the bottom package 104. The ICs 118 in the top package 102 can then be accessed via the lower electronic substrate 106.

In a conventional POP arrangement, the IC 124 in the bottom package 104 is typically coupled to at least some of the leads 108 of the lower electronic substrate 106. In the exemplary arrangement shown in FIG. 1, IC 124 is configured in a flip-chip arrangement. That is, the IC 124 is attached to the upper electronic substrate 110 and solder balls 126 are formed on the IC 124. The upper electronic substrate 110 and the IC 124, face down, are then placed on the lower electronic substrate 106. The terminals of the upper electronic substrate 110 can be coupled to terminals (not shown) of the lower electronic substrate 106 using one or more bonding wires 127. In the flip-chip arrangement, the lower electronic substrate 106 can have a plurality of terminals (not shown) on its upper surface coupled to at least some of the leads 108 of the bottom package 104. In other arrangements, the IC 124 can be attached and wire bonded to the terminals on the lower electronic substrate 106. The terminals can be used to access an interconnect system 129 of the lower electronic substrate 106 that is coupled to the leads 108. Underfill 128 and molding 130 layers can then be used to attach the IC 124 and the upper and lower electronic substrates 110, 106 together.

In this conventional POP arrangement, EMI shielding between the top and bottom packages 102, 104 is generally not practical, as inserting additional structure between the packages can prohibitively increase the size of the stacked packages. Therefore, designers typically avoid combining EMI reactive ICs in such an arrangement, as previously described.

In contrast, the various embodiments of the present invention allow close placement of EMI reactive ICs by the incorporation of electromagnetic shield layers into already existing electronic substrates. For example, as shown in FIG. 1, electromagnetic shielding can be provided for IC 124 by using a Faraday cage formed comprising the upper and lower electronic substrates 110, 106 of the bottom package 104. An upper shield layer 132 can be provided by coating the bottom surface of the upper electric substrate 110 with an electrically conductive layer. For example, as shown in FIG. 1, a metal layer can be applied on the bottom surface of the upper electric substrate 110, such as copper, aluminum, nickel, titanium, or any alloy thereof. In some cases, the electrically conductive layer can be formed by depositing a electrically conductive adhesive, as previously described. The lower shield layer 134 can be provided by one of the layers of the lower electronic substrate 106 of the bottom package 104. That is, configuring at least one of the electrically conducting layers of the lower electronic substrate 106 to provide electromagnetic shielding In the various embodiments, the lower shield layer 134 can be coupled to one of leads 108 coupled to a ground plane of an electronic device (not shown). As previously described, the thickness of the upper and lower shield layers 132, 134 are selected to ensure blocking of the EMI.

The sidewalls of the Faraday cage for IC 124 are provided by conductive adhesive portions 136 contacting the facing surfaces of the upper and lower electronic substrates 110, 106 to electrically and mechanically couple the upper and lower shield layers 132, 134. In the case of upper shield layer 132, the conductive adhesive 136 can directly contact the upper shield layer 132. In the case of lower shield layer 134, a plurality of vias 138 can be provided to electrically couple the adhesive 136 and the lower shield 134. The lower shield layer 134 is electrically coupled to one of the leads 108 connected to a grounding plane of the device. The thickness or bead (x) of the adhesive conductor portions should be sufficient, as previously described, to block EMI.

Although the bead size (x) can vary in the various embodiments, in one embodiment a silver-based epoxy bead size (x) between 100 to 200 um has been found to generally be sufficient to block EMI by IC's, including EMI in the range of 800 to 2700 MHz, the range of frequencies typically used for wireless communications. However the invention is not limited in this regard and the bead size can be selected to block EMI generated at any frequency. For example, the upper and lower shields layers 132, 134, the via 138, and the conductive adhesive can also be adapted for shielding IC's from radiation generated in and around diagnostic radiography equipment including, but not limited to, computerized tomography (CT) and other x-ray imaging equipment, magnetic resonance imaging equipment, radionuclide imaging or nuclear scintigraphy equipment, and positron emission tomography (PET).

Figure 2A:
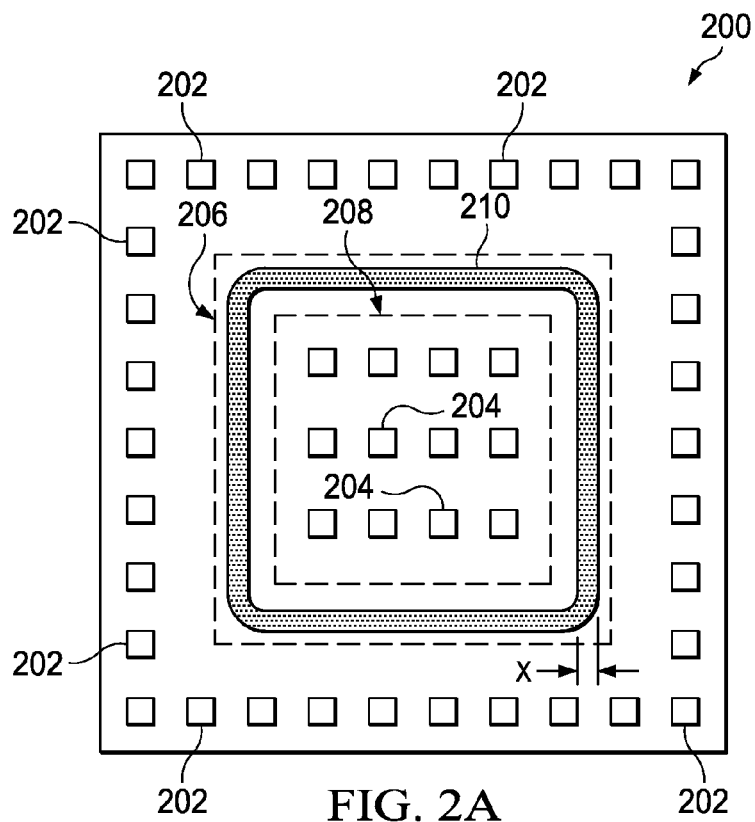
FIG. 2A shows a first exemplary bonding pattern for a package adhesive, according to an embodiment of the present invention.
Figure 2B:
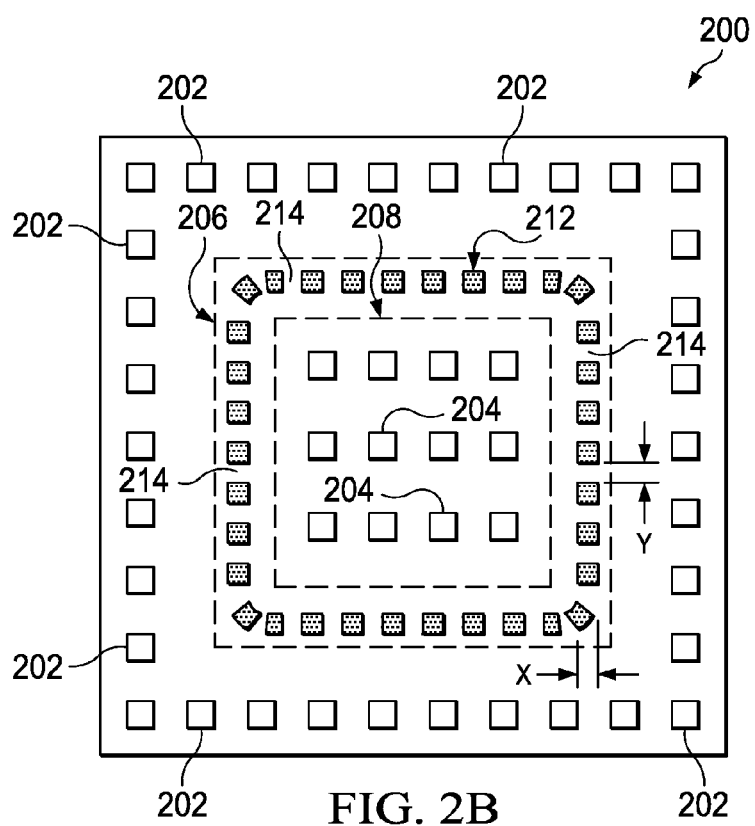
FIG. 2B shows a second exemplary bonding pattern for a package adhesive, according to an embodiment of the present invention.

In the various embodiments of the present invention, the conductive adhesive can be applied in a variety of patterns and still effectively block EMI. FIGS. 2A and 2B show a first and second exemplary bonding patterns for a package adhesive, according to the various embodiments. For example, FIGS. 2A and 2B show top views of the lower electronic substrate 200 of a flip-chip based bottom package for a POP packaging system. The lower electronic substrate 200 can have a first plurality of terminals 202 on its upper surface for coupling bonding wires from the upper electronic substrate, as previously described. The lower electronic substrate 200 can also have a second plurality of terminal 204 for coupling a flip-chip based IC. Regions 206, 208 define the footprint of the upper electronic substrate and the IC, respectively.

Prior to placement of the upper electronic substrate and the IC, the conductive adhesive can be applied. One of ordinary skill in the art will recognize that some materials for the conductive adhesive will have a non-rectangular cross-section. Therefore, the minimum thickness and/or bead size required will be based on the thinnest part of the resulting conductive adhesive cross-section. "Bead size" as used herein refers to the cross-sectional dimensions of the conductive adhesive, including is height and thickness (x). Additionally, conductive adhesive can be applied in varying types of bonding patterns. For example, as shown in FIG. 2A, a continuous bonding pattern 210 between regions 206 and 208 can be provided. In such embodiments, with a sufficient bead size, as previously described, the continuous bonding pattern can effectively block all EMI. In another example, as shown in FIG. 2B, a non-continuous bonding pattern 212 can instead be provided. In such embodiments, the non-continuous bonding pattern 212 can include one or more voids 214. The void width (y) can be selected such that the dimensions are smaller than the wavelengths of EMI to be block, as previously described. In such embodiments, each portion of the non-continuous pattern can contact one or more vias in the electronic substrates. The portions can be of any length. For example, in some embodiments, the non-continuous pattern 212 can be formed using a group of solder or epoxy balls. Alternatively, a length or solder or epoxy can also be used. Although the exemplary bonding patterns are shown to uniformly surround the IC region 206, a bonding pattern can be formed to follow any path provided coupling of the upper and lower shield layers is still provided and the adhesive continues to electromagnetically surround the IC region 206.

Referring back again to FIG. 1, the dimensions of the vias can be selected such that the spacing between the vias 138 is also appropriate for the EMI to be blocked. That is, the number, spacing, and widths of the vias 138 should be sufficient to prevent any significant amounts of EMI from reaching the IC 124 based on the composition of the vias 138. However, the spacing between the conductive adhesive 136 and each of the shield layers is typically less than 100 um. Typically, such spacing is sufficient to block EMI from laterally placed sources and is not a significant path for EMI in the case of stacked packages.

As previously described, the lower electronic substrate 104 can contain a plurality of layers having wiring layers 129 for contacting the leads 108. Although the lower shield layer 134 can be formed as a solid sheet in some embodiments, in other embodiments, the lower shield layer 134 can be patterned. In such embodiments, the patterning allows wiring layers 129 in the lower electric substrate 106 to have a shorter length to the leads 108. However, to maintain Faraday cage integrity, any openings in the lower shield layer 134 can have dimensions less than the wavelengths of the EMI to be blocked.

Figure 3:
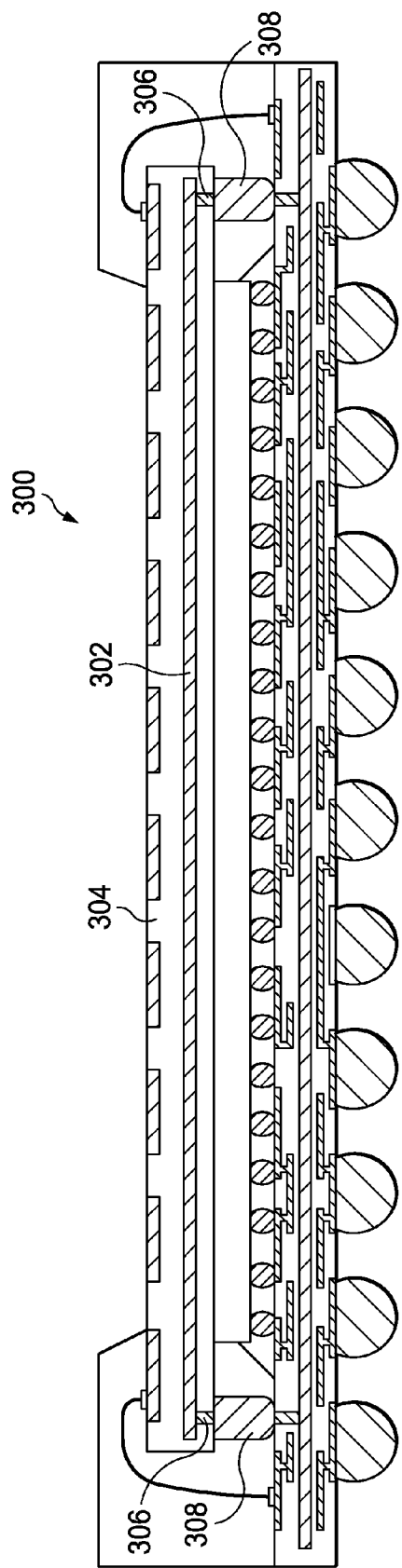
FIG. 3 shows an exemplary packaged integrated circuit, according to another embodiment of the present invention.

In other embodiments of the present invention, the upper shield layer for the Faraday cage need not be formed on a surface of an upper electronic substrate, as shown in FIG. 1. Rather, as shown in FIG. 3, the upper shield layer 302 can be instead formed in an inner layer of the upper electronic substrate 304 of the lower package 300. In such embodiments, vias 306 can be provided to electrically couple the conductive adhesive 308 to the upper shield layer 302. The upper shield layer 302 can also be patterned, as previously described for the lower shield layer 134 in FIG. 1. The number, spacing, and widths of vias 306 can also be configured as previously described for vias 138 in FIG. 1.

Figure 4:
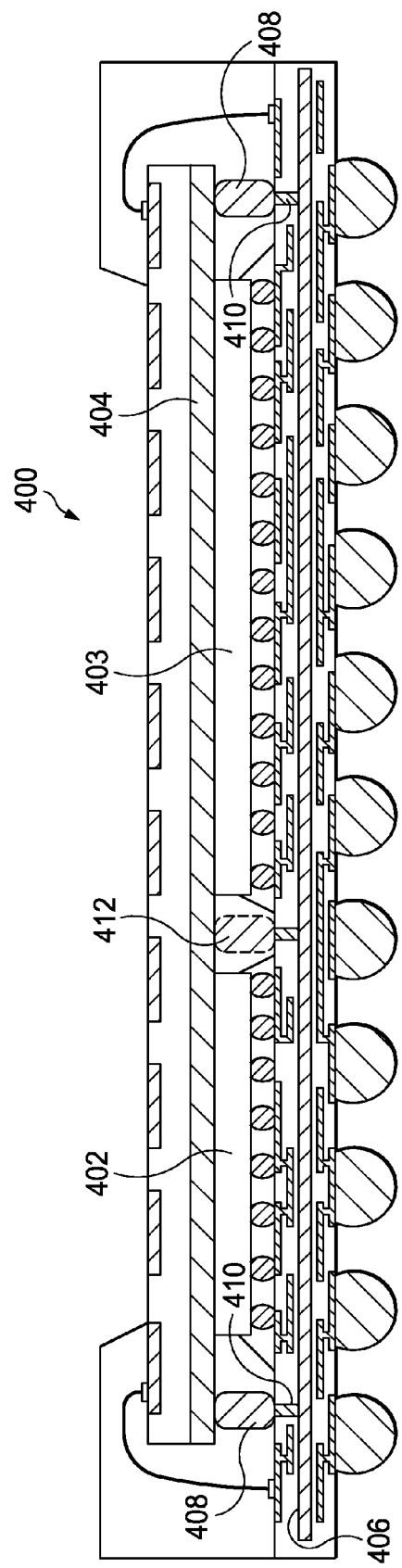
FIG. 4 shows an exemplary multi-chip package, according to an embodiment of the present invention.

In some embodiments of the present invention, more than one IC can be shielded. For example, FIG. 4 shows an exemplary multi-chip package, according to an embodiment of the present invention. In FIG. 4, a bottom package 400 can include two or more ICs 402, 403 shielded using upper and lower shielding layers 404, 406, a conductive adhesive 408, and vias 410, as previously described for FIG. 1. In some embodiments, additional shielding can be provided between ICs 402 and 403 by providing an additional conductive adhesive portion 412 therebetween.

Figure 5:
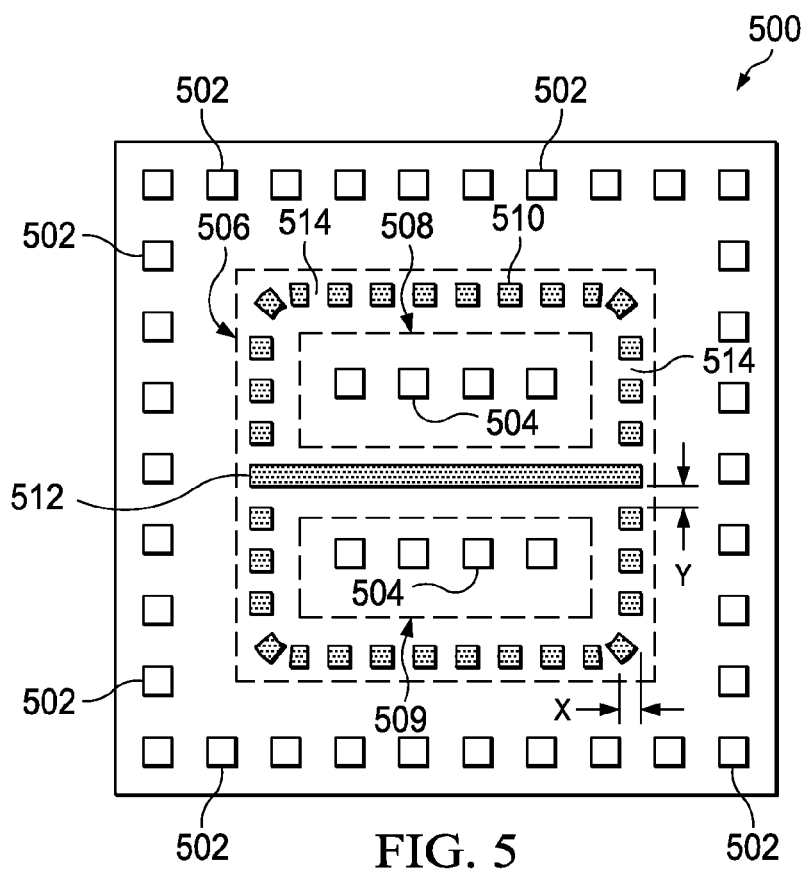
FIG. 5 shows a exemplary bonding pattern for a package adhesive in a multi-chip package, according to an embodiment of the present invention.

As described above for FIGS. 2A and 2B, the conductive adhesive for the arrangement in FIG. 4 can be formed in a variety of patterns and still effectively block EMI. For example, FIG. 5 shows a top view of the lower electronic substrate 500 of a flip-chip based bottom package for a POP packaging system for packing two dies according to an embodiment of the present invention. The lower electronic substrate 500 can have a first plurality of terminals 502 on its upper surface for coupling bonding wires from the upper electronic substrate. The lower electronic substrate 500 can also have a second plurality of terminal 504 for coupling a flip-chip based IC. Regions 506, 508, and 509 define the footprint of the upper electronic substrate, a first IC, and a second IC, respectively.

As previously described, the bonding pattern can vary. For example, a continuous bonding pattern can be provided around the IC regions 508 and 509. In such embodiments, with a sufficient bead size (x), as previously described, the continuous bonding pattern can effectively block all EMI. In another example, as shown in FIG. 5, a non-continuous bonding pattern 510 can be provided, as previously described in FIG. 3B. In such embodiments, the non-continuous bonding pattern 510 can include one or more voids 514. The void size (y) can be selected such that the dimensions are smaller than the wavelengths of EMI to be block, as previously described.

The bonding pattern 510 can also include additional portions 512. As with the bonding pattern 510, the pattern for portion 512 can also vary. For example, in some cases, if a non-continuous bonding pattern is provided, the void size (y) may be sufficient to block EMI originating from an location exterior to the ICs, but not for blocking EMI between the ICs. In such embodiments, any voids in portion 512 can be adjusted to provide additional EMI shielding between the ICs. For example, as shown in FIG. 5, a continuous pattern can be provided for portion 512 if the ICs are more sensitive to each other than to the surrounding environment.

Figure 6:
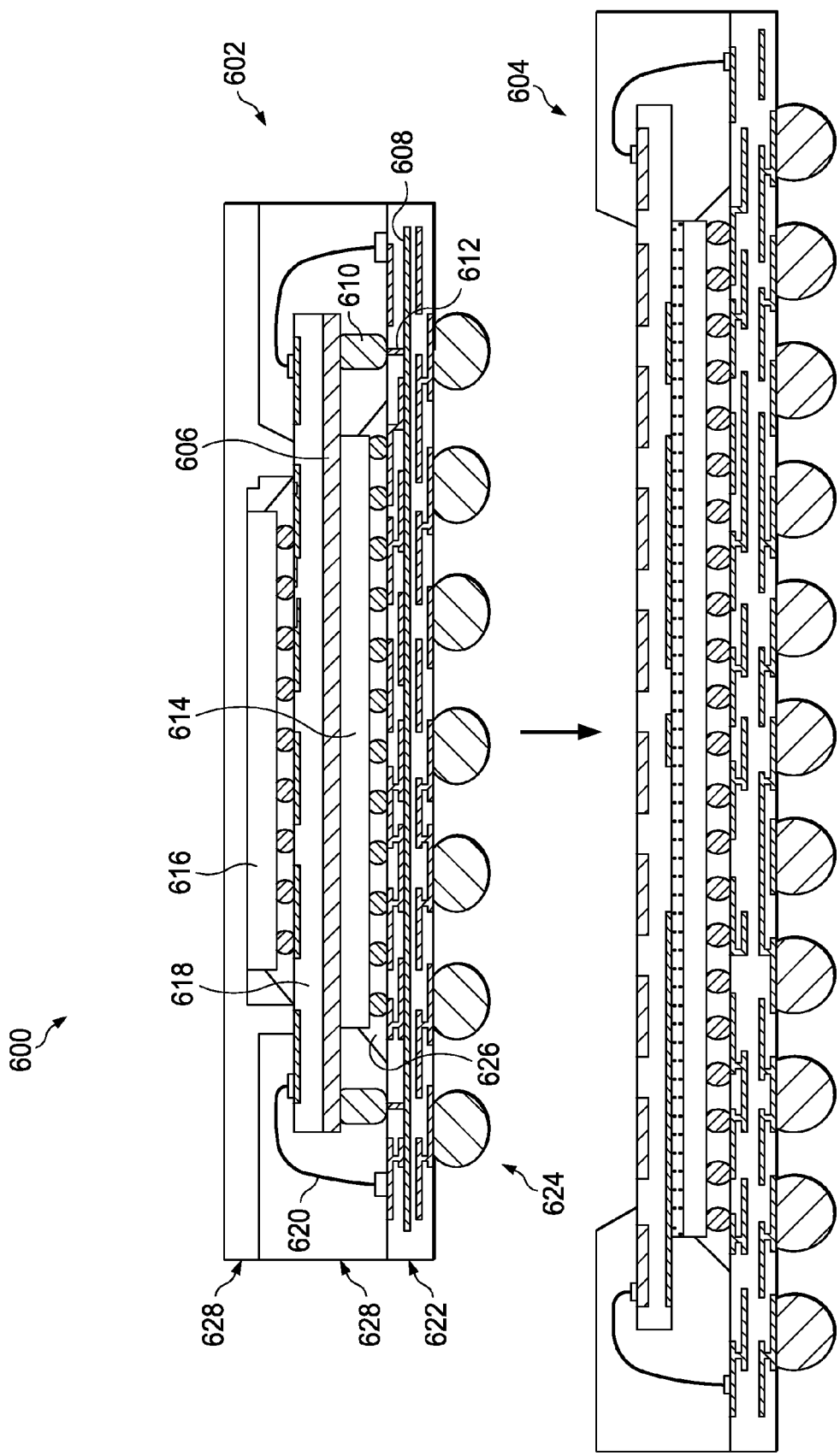
FIG. 6 shows an exploded view of another exemplary multi-chip stacked packaging system, according to still another embodiment of the present invention.

In FIGS. 1-5, the Faraday cage is implemented in the bottom package of the POP system. However, the invention is not limited in this regard and can be implemented in any package in which an IC is sandwiched between two electronic substrates. For example, FIG. 6 shows an exploded view of another exemplary multi-chip stacked packaging system, according to still another embodiment of the present invention. In FIG. 6, the Faraday cage can be implemented in a top package 602 of the POP system 600. In such embodiments the bottom package 604 can also optionally include a Faraday cage, as described in FIGS. 1-5. However, as shown in FIG. 6, the Faraday cage is only implemented in top package 602. In such embodiments, the top package 602 can include upper and lower shield layers 606, 608, walls from conductive adhesive 610, and vias 612 necessary for shielding IC 614 from EMI, as previously described for FIG. 1.

Furthermore, the top package 602 in FIG. 6 also illustratively shows how the present invention can be implemented in a stacked IC system (non-POP). In such embodiments, a second IC 616 can be mounted on the upper surface of the second electronic substrate. As shown in FIG. 6, the second IC 616 is mounted in a flip-chip configuration, contacting a plurality of terminals (not shown) on the upper surface of the second electronic substrate. The terminals can be connected via bonding wires 620 to terminals on the upper surface of the lower electronic substrate 622 and out to leads 624 as previously described. Molding 628 and underfill 626 layers can then be used to encapsulate the ICs 616, 614.

The various embodiments of the present invention have been described principally in terms of flip-chip applications; however the invention is not limited in this regard. In some embodiments, bonding wires can be used to directly contact terminals on the surface of ICs to terminals of the lower or upper electronic substrates been used. Furthermore, as shown in FIG. 1, a combination of wire bonding and flip-chip methods can be used.

These are but a few examples. Accordingly, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A packaged integrated circuit, comprising:
   a first electronic substrate comprising a first plurality of layers and at least a first circuit coupling feature at an upper surface of said first electronic substrate, said first plurality of layers comprising at least a first electromagnetic interference (EMI) shielding layer;
   a second electronic substrate having an upper surface attached to a lower surface of said first electronic substrate by one or more portions of an electrically conductive adhesive material, said second electronic substrate comprising a second plurality of layers and at least a second circuit coupling feature at a lower surface of said second electronic substrate, said first plurality of layer comprising at least a second EMI shielding layer; and
   at least one functional die disposed between said first and said second electronic substrate and functionally coupled to at least one among said first and said second circuit coupling features,
   wherein each of said adhesive material portions electrically couples said first and said second shielding layers.

2. The integrated circuit of claim 1, wherein said second electronic substrate further comprises at least one terminal on said upper surface of said second electronic substrate electrically coupled to said second shielding layer.

3. The integrated circuit of claim 2, wherein said first electronic substrate further comprises at least one terminal on said lower surface of said first electronic substrate electrically coupled to said first shielding layer.

4. The integrated circuit of claim 2, wherein one of said first plurality of layers at a lower surface of said first electronic substrate comprises said first shielding layer.

5. The integrated circuit of claim 1, wherein said adhesive is formed in a bonding pattern, said bonding pattern defining at least one region between said first and said second electronic substrates free of said adhesive.

6. The integrated circuit of claim 1, wherein at least two functional die are disposed between said first and said second electronic substrates, wherein said adhesive is formed in a bonding pattern, and wherein said adhesive in said bonding pattern electromagnetically surrounds at least one of said functional die.

7. The integrated circuit of claim 1, wherein said adhesive is a polymer-comprising conductive adhesive.

8. A method for packaging an integrated circuit, comprising:
   providing a first electronic substrate comprising a first plurality of layers and at least a first circuit coupling feature at an upper surface of said first electronic substrate, said first plurality of layer comprising at least a first electromagnetic interference SEMI) shielding layer;
   providing a second electronic substrate comprising a second plurality of layers and at least a second circuit coupling feature at a lower surface of said second electronic substrate, said second plurality of layers comprising at least a second EMI shielding layer;
   attaching at least one functional die to a lower surface of said first electronic substrate or an upper surface of said second electronic substrate and functionally coupling said functional die to at least one among said first and said second circuit coupling features; and
   attaching said upper surface of said second electronic substrate to said lower surface of said first electronic substrate by one or more portions of an electrically conductive adhesive, wherein each of said adhesive portions electrically couple said first and said second shielding layers.

9. The method of claim 8, wherein said attaching step further comprises placing said adhesive in contact with at least one terminal on said upper surface of said second electronic substrate electrically coupled to said second shielding layer.

10. The method of claim 9, wherein said attaching step further comprises placing said adhesive in contact with at least one terminal on said lower surface of said first electronic substrate electrically coupled to said first shielding layer.

11. The method of claim 9, wherein one of said first plurality of layers at a lower surface of said first electronic substrate comprises said first shielding layer.

12. The method of claim 8, wherein said attaching step further comprises placing said adhesive on one of said first and said second electronic substrates in a bonding pattern, said bonding pattern defining at least one region between said first and said second electronic substrates free of said adhesive.

13. The method of claim 8, wherein at least two functional die are disposed between said first and said second electronic substrates, wherein said adhesive is formed in a bonding pattern, and wherein said adhesive in said bonding pattern electromagnetically surrounds at least one of said functional die.

14. The method of claim 12, wherein said adhesive is a polymer-comprising conductive adhesive.

15. A integrated circuit packaging system, comprising:
- at least one top package for packaging at least one top functional die, said top package comprising a plurality of top package leads coupled to said top functional die and extending from a lower surface of said top package; and
- a bottom package for packaging at least one bottom functional die, said bottom package comprising:
- a first electronic substrate comprising a first plurality of layers and a plurality of electrical terminals at an upper surface of said first electronic substrate for receiving said top leads, said first plurality of layer comprising at least a first electromagnetic interference (EMI) shielding layer, and
- a second electronic substrate having an upper surface attached to a lower surface of said first electronic substrate by one or more portions of an electrically conductive polymer comprising adhesive, said second electronic substrate comprising a second plurality of layers and a plurality of bottom package leads at a lower surface of said second electronic substrate, said second plurality of layers comprising at least a second EMI shielding layer,
- wherein said bottom die is disposed between said first and said second electronic substrate, wherein said adhesive portions electrically couple said first and said second shielding layers, and wherein said top and said bottom dies are functionally coupled to said bottom leads.

16. The system of claim 15, wherein said second electronic substrate further comprises at least one terminal on said upper surface of said second electronic substrate electrically coupled to said second shielding layer.

17. The system of claim 16, wherein said first electronic substrate further comprises at least one terminal on said lower surface of said first electronic substrate electrically coupled to said first shielding layer.

18. The system of claim 16, wherein a one of said first plurality of layers at a lower surface of said first electronic substrate comprises said first shielding layer.

19. The system of claim 15, wherein at least two bottom functional die are disposed between said first and said second electronic substrates, wherein said adhesive is formed in a bonding pattern, and wherein said adhesive in said bonding pattern electromagnetically surrounds at least one of said bottom functional die.

20. The system of claim 19, wherein said adhesive in said bonding pattern continuously surrounds said one bottom functional die.

* * * * *